(12) United States Patent
Lee et al.

(10) Patent No.: US 9,299,447 B2
(45) Date of Patent: Mar. 29, 2016

(54) 3-DIMENSIONAL SEMICONDUCTOR DEVICE HAVING MEMORY CELLS STACKED OVER SUBSTRATE

(71) Applicant: SK hynix Inc., Icheon-si Gyeonggi-do (KR)

(72) Inventors: Yeonghun Lee, Seongnam-si (KR); Hyun Heo, Seoul (KR); Min Gyu Koo, Icheon-si (KR); Dong Hwan Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/490,484

(22) Filed: Sep. 18, 2014

(65) Prior Publication Data

US 2015/0279471 A1    Oct. 1, 2015

(30) Foreign Application Priority Data

Mar. 25, 2014    (KR) .................. 10-2014-0034678

(51) Int. Cl.
*G11C 16/04* (2006.01)
*G11C 16/14* (2006.01)
*G11C 16/28* (2006.01)

(52) U.S. Cl.
CPC ............ *G11C 16/14* (2013.01); *G11C 16/0483* (2013.01); *G11C 16/28* (2013.01)

(58) Field of Classification Search
USPC ........................................ 365/185.11, 185.29
See application file for complete search history.

(56) References Cited

U.S. PATENT DOCUMENTS

| 2012/0069661 | A1* | 3/2012 | Iwai | G11C 16/0483 365/185.11 |
| 2012/0134210 | A1* | 5/2012 | Maeda | G11C 16/0483 365/185.11 |
| 2014/0355346 | A1* | 12/2014 | Park | G11C 16/3427 365/185.11 |

FOREIGN PATENT DOCUMENTS

| KR | 1020110092523 A | 8/2011 |
| KR | 1020130035553 A | 4/2013 |

* cited by examiner

*Primary Examiner* — Hoai V Ho
(74) *Attorney, Agent, or Firm* — William Park & Associates Ltd.

(57) ABSTRACT

A semiconductor device includes a plurality of memory blocks, wherein each of the plurality of memory blocks includes a first select transistor electrically coupled to a common source line, a second select transistor electrically coupled to a bit line, and a plurality of memory cells electrically coupled between the first and second select transistors, and an operation circuit suitable for applying operation voltages for a program operation, a read operation, and an erase operation to a selected memory block selected from the plurality of memory blocks, and applying a first positive voltage to gates of the first select transistors in unselected memory blocks of the plurality of memory blocks when an erase voltage is applied to the common source line during the erase operation.

16 Claims, 12 Drawing Sheets

3-DIMENSIONAL SEMICONDUCTOR DEVICE HAVING MEMORY CELLS STACKED OVER SUBSTRATE

CROSS-REFERENCE TO RELATED APPLICATION

The present application claims priority to Korean patent application number 10-2014-0034678 filed on Mar. 25, 2014, in the Korean Intellectual Property Office, the entire disclosure of which is incorporated by reference herein.

BACKGROUND

1. Technical Field

Various embodiments relate generally to a semiconductor device, and more particularly, to a semiconductor device including memory cells.

2. Related Art

Advances in technology have led to the increases in the density of memory cells in semiconductor devices and changes in the operation of such semiconductor devices.

A three-dimensional semiconductor device typically includes a plurality of memory cells stacked over a substrate. A vertical channel layer forms a channel region of the vertically stacked memory cells. The vertical channel layer replaces a bulk (such as for example, well) that is typically used in a two-dimensional semiconductor device.

BRIEF SUMMARY

An embodiment of a semiconductor device includes a plurality of memory blocks, wherein each of the plurality of memory blocks includes a first select transistor electrically coupled to a common source line, a second select transistor electrically coupled to a bit line, and a plurality of memory cells electrically coupled between the first and second select transistors, and an operation circuit suitable for applying operation voltages for a program operation, a read operation, and an erase operation to a selected memory block selected from the plurality of memory blocks, and applying a first positive voltage to gates of the first select transistors in unselected memory blocks of the plurality of memory blocks when an erase voltage is applied to the common source line during the erase operation.

BRIEF DESCRIPTION OF THE DRAWINGS

FIG. 5B is a graphical representation of relationships between word lines and voltages associated with the memory string of FIG. 5a;

DETAILED DESCRIPTION

Various embodiments will be described with reference to the accompanying drawings.

Figure 1:
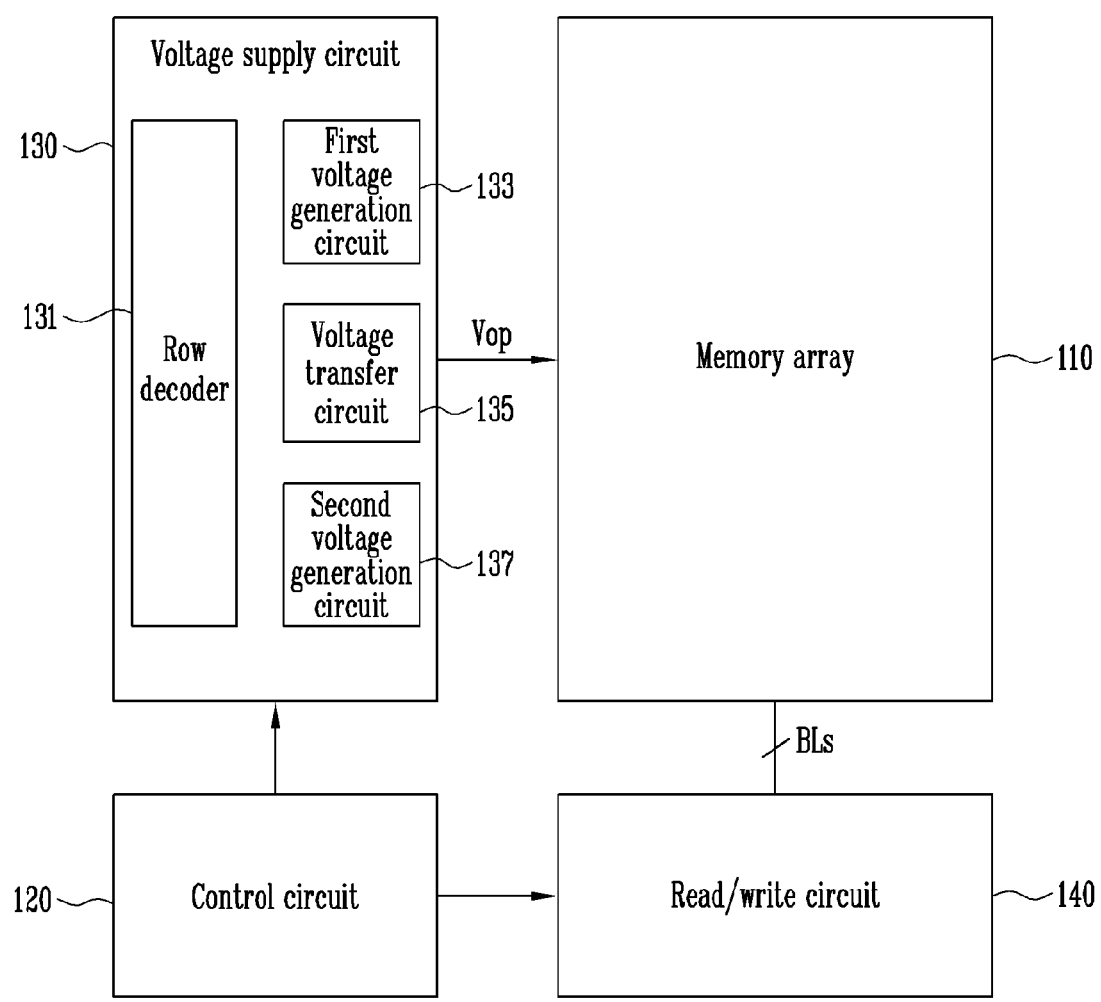
FIG. 1 is a block diagram representation of an embodiment of a semiconductor device.

FIG. 1 is a block diagram representation of an embodiment of a semiconductor device.

The semiconductor memory device may include a memory array 110 and an operation circuit. The operation circuit may include a control circuit 120, a voltage supply circuit 130 and a read/write circuit 140.

The memory array 110 may include a plurality of memory blocks. Each of the plurality of memory blocks may include a plurality of memory strings. Each of the plurality of memory strings may include a plurality of memory cells. In a flash memory device, the plurality of memory blocks may include a plurality of flash memory cells. For example, each of the plurality of memory blocks may include a plurality of flash memory cells where each flash memory cell includes a floating gate formed of polysilicon and a charge storage layer formed of a nitride layer.

A memory block may include memory strings electrically coupled to bit lines and coupled in parallel with a source line. The memory strings may be formed in a two-dimensional structure or in a three-dimensional structure over a semiconductor substrate. A memory block including three-dimensional memory strings is described below.

Figure 2:
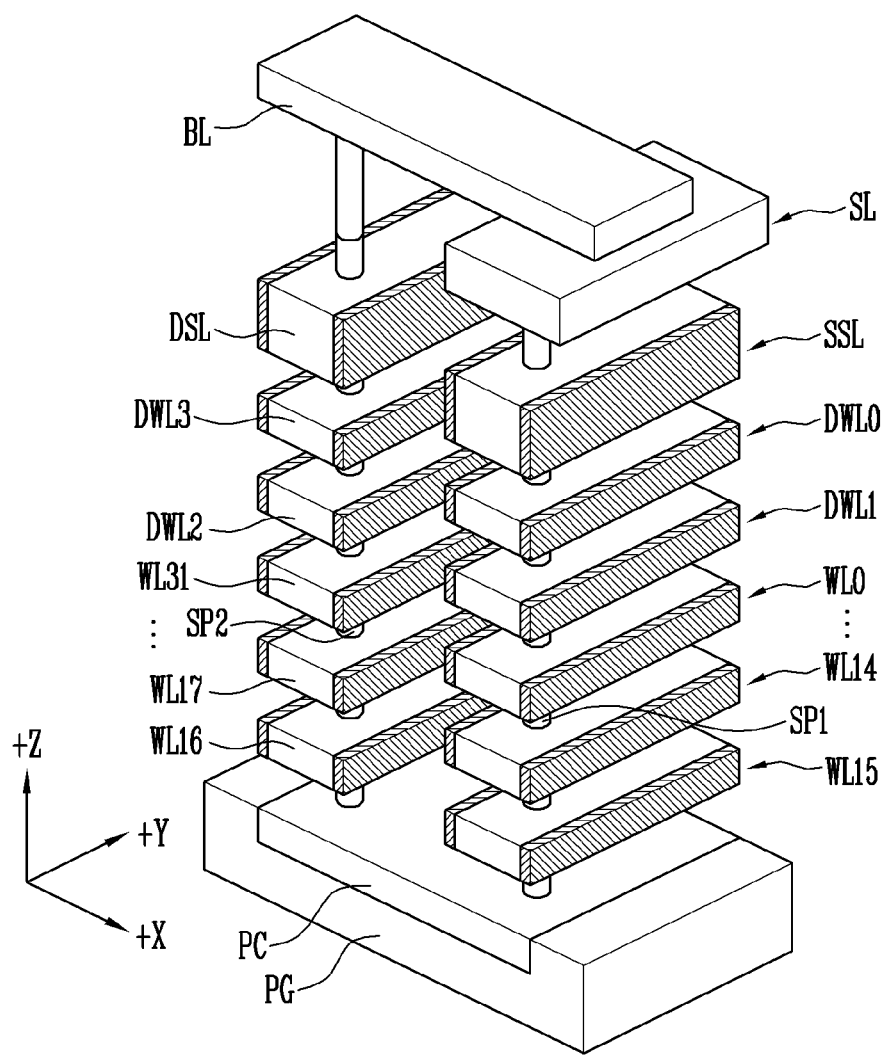
FIG. 2 is an illustration of an embodiment of a memory string of a memory array shown in FIG. 1.
Figure 3:
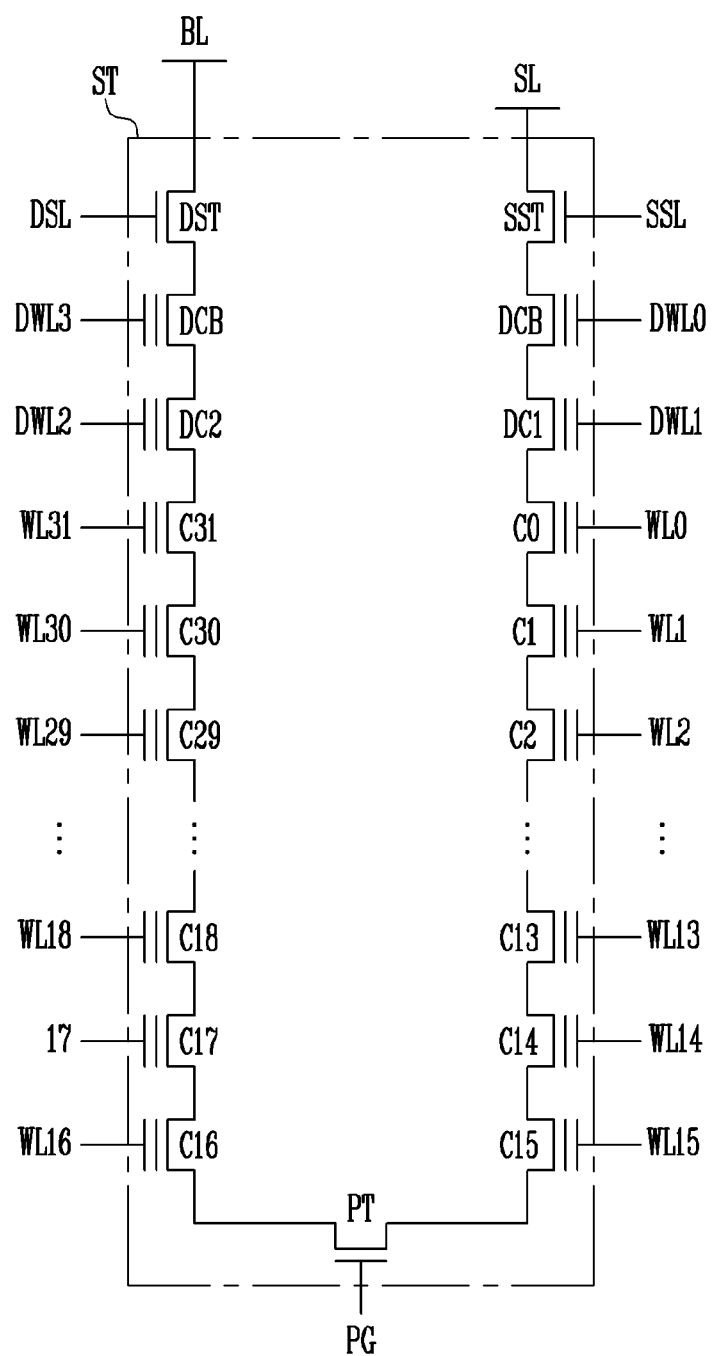
FIG. 3 is a circuit diagram representation of an embodiment of a memory string of FIG. 2.

FIG. 2 is an illustration of an embodiment of a memory string of a memory array of FIG. 1 and FIG. 3 is a circuit diagram representation of an embodiment of a memory string of a memory array of FIG. 1.

A pipe gate PG including a recess may be formed over a semiconductor substrate (not shown). A pipe channel layer PC may be formed in the recess of the pipe gate PC. A plurality of vertical channel layers SP1, SP2 may be formed on the pipe channel layer PC. A top portion of a first vertical channel layer SP1 may be electrically coupled to a common source line SL, and a top portion of a second vertical channel layer SP2 may be electrically coupled to a bit line BL. The vertical channel layers SP1, SP2 may be formed of polysilicon.

The second vertical channel layer SP2 may extend through a plurality of conductive layers DSL, DWL3, DWL2, WL16-WL31. The plurality of conductive layers DSL, DWL3, DWL2, WL16-WL31 may be formed at different heights along the length of the second vertical channel layer SP2. The first vertical channel layer SP1 may extend through a plurality of conductive layers SSL, DWL0, DWL1, WL0-WL15. The plurality of conductive layers SSL, DWL0, DWL1, WL0-WL15 may be formed at different heights along the length of the first vertical channel layer SP1. A multi-layer (not shown) including a charge storage layer may be formed on the surfaces of the vertical channel layers SP1, SP2 and a surface of the pipe channel layer PC. The multi-layer may be formed between the vertical channel layers SP1, SP2 and the conductive layers DSL, DWL3, DWL2, WL16-WL31, SSL, DWL0. DWL1, WL0-WL15 and between the pipe channel layer PC and the pipe gate PG.

The uppermost conductive layer that the second vertical channel layer SP2 extends through may be a drain select line DSL. The conductive layers disposed below the drain select line DSL along the length of the second vertical channel layer SP2 may be word lines DWL3, DWL2, WL16-WL31. The word lines may include dummy word lines DWL3, DWL2 and main word lines WL16-WL31. The uppermost conductive layer that the first vertical channel SP1 extends through may be a source select line SSL. The conductive layers disposed below the source select line SSL along the length of the first vertical channel SP1 may be word lines DWL0, DWL1, WL0-WL15. The word lines may include dummy word lines DWL0, DWL1 and main word lines WL0-WL15.

The first conductive layers SSL, DWL0, DWL1, WL0-WLk and the second conductive layers DSL, DWL3, DWL2, WLn-WLk+1 may be stacked at different regions of the semiconductor substrate. The first vertical channel layer SP1 extending through the first conductive layers SSL, DWL0, DWL1, and WL0-WLk may be vertically electrically coupled between the source line SL and the pipe channel layer PC. The second vertical channel layer SP2 extending through the second conductive layers DSL, DWL3, DWL2, WLn-WLk+1 may be vertically electrically coupled between the bit line BL and the pipe channel layer PC.

A drain select transistor DST may be formed in the section where the second vertical channel layer SP2 extends through the drain select line DSL. Dummy cell transistors DC3, DC2 and main cell transistors C16-C31 may be formed in the sections where the second vertical channel SP2 extends through the word lines DWL3, DWL2, WLn-WLk+1. A source select transistor SST may be formed in the section where the first vertical channel layer SP1 extends through the source select line SSL. Dummy cell transistors DC0, DC1 and main cell transistors C0-Ck may be formed in the sections where the first vertical channel layer SP1 extends through the dummy word lines DWL,0 DWL1 and the word lines WL0-WLk.

The memory string ST having the above-described structure may include the drain select transistor DST, dummy cell transistors DC3, DC2 and main cell transistors C16-C31 vertically coupled to the substrate between the bit line BL and the pipe channel layer PC, and the source select transistor SST, the dummy cell transistors DC0, DC1, and the main cell transistors C0-C15 vertically coupled to the substrate between the common source line CSL and the pipe channel layer PC.

As described above, four dummy word lines DWL0-DWL3 and thirty-two main word lines WL0-WL31 may be formed. However, a different number of dummy word lines and main word lines may be used.

Referring back to FIG. 1, the operation circuit may be configured to perform a program loop, an erase loop and a read operation of the memory cells in a selected memory block. The program loop may include a program operation and a verify operation, and the erase loop may include an erase operation and a verify operation. In order to perform the program loop, the erase loop and the read operation, the operation circuit may be configured to selectively output operation voltages Vop to local lines SSL, DWL0, DWL3, WL0-WLn, DSL and to the common source line SL of the selected memory block. The operation circuit may be configured to manage the charging and discharging of the bit lines BLs and to sense a current flow (or voltage variation) in the bit lines BLs.

The operation circuit may be configured to apply a first positive voltage to the gates of the first select transistors (source select transistors) in the unselected memory blocks when an erase voltage is applied to the common source line SL during the erase operation. In a NAND flash memory device, the operation circuit may include a control circuit 120, a voltage supply circuit 130 and a read/write circuit 140.

The control circuit 120 may manage the generation of the operation voltages by the voltage supply circuit 130 at specified levels to perform the program loop, the erase loop, and the read operation in response to an external command signal. The operation voltages are applied to the local lines SSL, DWL0-DWL3, WL0-WLn, DSL and to the common source line SL of a selected memory block. The control circuit 120 may manage the operation of the read/write circuit 140 to control the charging and discharging of the bit lines BLs or to sense the flow of the current of the bit lines BLs to perform the program loop, the erase loop and the read operation.

The voltage supply circuit 130 may generate the operation voltages Vop for the program loop, the erase loop and the read operation of the memory cells under the control of the control circuit 120. The operation voltages Vop may include, but are not limited to, a program voltage, a read voltage, an erase voltage, a pass voltage, a select voltage, and a common source voltage. The voltage supply circuit 130 may transmit the operation voltages Vop to the local lines SSL, WL0-WLn, DSL and to the common source line SL of the selected memory block in response to the row address signal (not shown) received from the control circuit 120.

The voltage supply circuit 130 may individually control the voltages applied to the source select line SSL and to the dummy word lines DWL0, DWL1 of unselected memory blocks during the erase operation. The voltage supply circuit 130 may include a first voltage generation circuit 133, a row decoder 131, a voltage transfer circuit 135 and a second voltage generation circuit 137.

Figure 4:
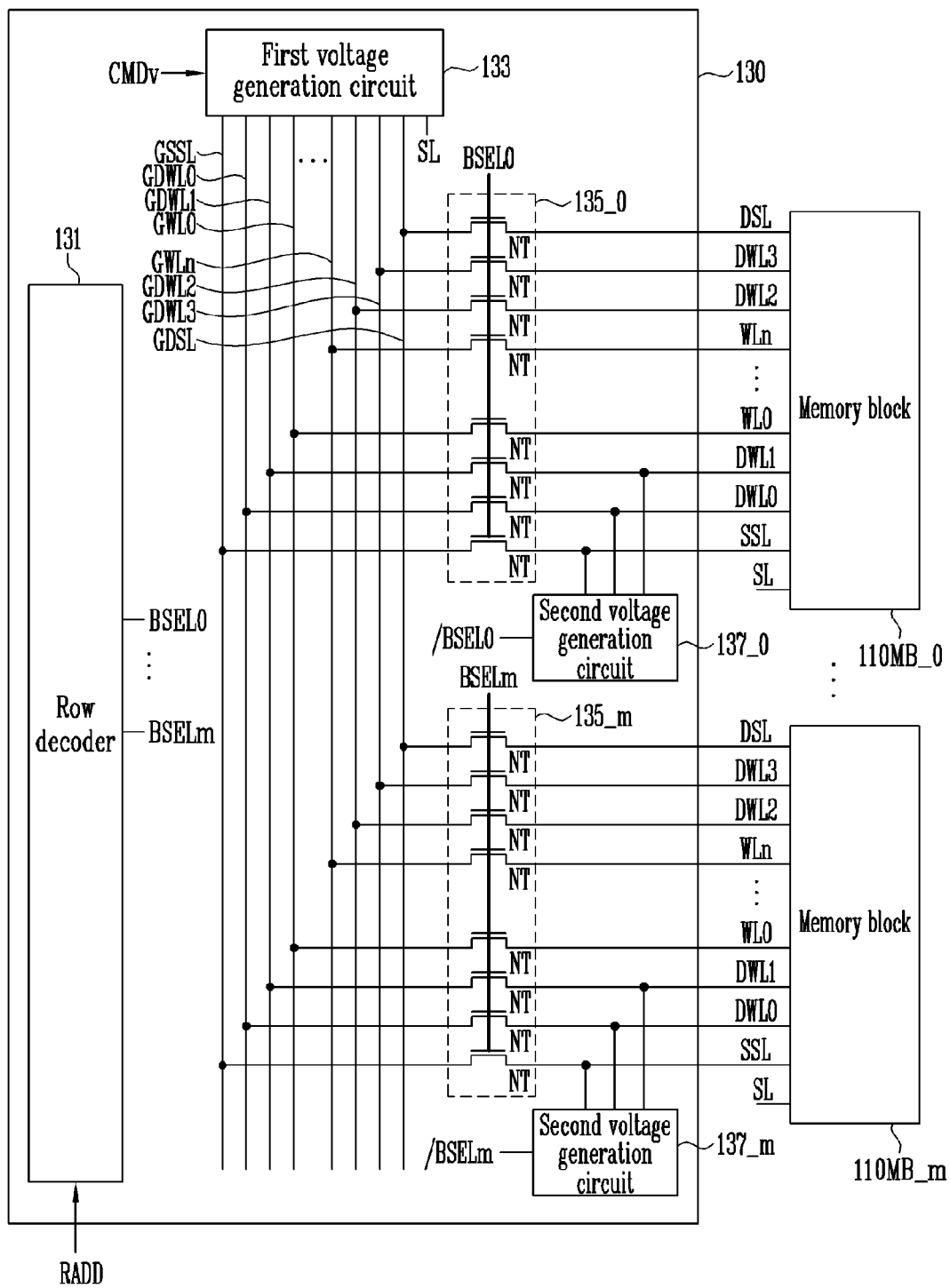
FIG. 4 is a circuit diagram representation of an embodiment of a voltage supply circuit.

FIG. 4 is a circuit diagram representation of an embodiment of a voltage supply circuit 130.

The voltage supply circuit 130 may generate the operation voltages for the program loop, the read operation and the erase loop of the memory cells in response to a voltage control signal CMDv received from the control circuit 120. The voltage supply circuit 130 may supply the operation voltages to the local lines SSL, DWL0-DWL3, WL0-WLn, DSL and to the common source line SL of the selected memory block (for example, 110MB_0) in response to a row address signal RADD received from the control circuit 120.

The voltage supply circuit 130 may include the first voltage generation circuit 133, the row decoder 131, the voltage transfer circuit (135_0-135_m), and the second voltage generation circuit (137_0-137_m).

The first voltage generation circuit 133 may transmit the operation voltages to global lines GSSL, GDWL0-GDWL3, GWL0-GWLn, GDSL in response to a voltage control signal CDMv. For example, the first voltage generation circuit 133 may apply a program voltage to a selected global word line and a pass voltage to unselected global word lines during the program operation. The first voltage generation circuit 133 may apply a program verify voltage to the selected global word line and the pass voltage to the unselected global word lines during a program verify operation. The first voltage generation circuit 133 may apply a read voltage to the selected global word line and a pass voltage to the unselected global word lines during the read operation. During the erase operation, the first voltage generation circuit 133 may apply an erase permission voltage (for example, 0V) to the global word lines. The first voltage generation circuit 133 may apply an erase verify voltage to the global word lines during an erase verify operation. The first voltage generation circuit 133 may make adjustments so that the voltages may be applied to the global lines GSSL, GDWL0-GDWL3, GWL0-GWLn, GDSL at different times. The adjustments may improve operating characteristics. The first voltage generation circuit 133 may change the operation voltages at selected levels among various levels. The first voltage generation circuit 133 may output and change the operating voltages in response to the voltage control signal CMDv received from the control circuit 120.

The row decoder 131 may transmit block select signals BSEL[0:m] to a select memory block selected from the plurality of the memory blocks in response to a row address signal RADD received from the control circuit 120. For example, a single block select signal may be activated, and the remaining block select signals may be deactivated in accordance with the row address signal RADD.

The voltage transfer circuit 135 may include voltage transfer units 135_0-135_m. Each of the voltage transfer units 135_0-135_m may be associated with one of the memory blocks 110MB_0-110MB_m. Each of the voltage transfer units 135_0-135_m may transfer the operation voltages generated by the voltage generation circuit 133 to the local lines SSL, DWL0-DWL3, WL0-WLn, GDSL of the selected memory block in response to the block selection signals BSEL[0:m] received from the row decoder 131. Each of the voltage transfer units 135_0-135_m may electrically couple the global word lines GSSL, GDWL0-GDWL3, GWL0-GWLn, GDSL to the local lines SSL, DWL0-DWL3, WL0-WLn, GDSL of the selected memory block in response to the block selection signals BSEL[0:m] received from the row decoder 131.

The second voltage generation circuits 137_0-137_m may be configured to apply the first positive voltage to the gates of the first select transistors (for example, source select transistors) in the unselected memory blocks when the first voltage generation circuit 133 applies the erase voltage to the common source line SL during the erase operation. Each of the second voltage generation circuits 137_0-137_m may be associated with a memory block 110MB_0-110MB_m. Each of the second voltage generation circuits 137_0-137_m may operate in response to an associated inverted block select signals /BSEL0-/BSELm.

The transistors NT of the voltage transfer units (for example, 135_m) of the unselected memory blocks 110MB_m may be turned off by the deactivated block select signals (for example, BSELm). The local lines SSL, DWL0-DWL3, WL0WLn, DSL of the unselected memory blocks 110MB_m may be in a floating state. The second voltage generation circuits (for example, 137_m) of the unselected memory blocks 110MB_m may apply a positive voltage to the first select line (for example, the source select line SSL) of the unselected memory blocks 110MB_m.

The second voltage generation circuits 137_m of the unselected memory blocks 110MB_m may apply another positive voltage to the dummy word lines DWL0-DWL1 during the erase operation when the dummy cell transistors are included in the memory cell transistors or the dummy word lines DWL0-DWL1 are included in the word lines. The second voltage generation circuits 137_m may apply the positive voltage to the dummy word lines DW0-DWL1 adjacent to the first selected line SSL. The positive voltage applied to the dummy word lines DWL0-DWL1 may be relatively lower than the positive voltages applied to the first select line SSL.

During an erase operation, the main word lines WL0-WLn of the main cell transistors, the dummy word lines DWL2-DWL3 of the dummy cell transistors, and the second select line DSL of the second select transistor of the unselected memory blocks 110MB_m may be set to a floating state. The positive voltages may be applied to the first select line SSL of the first select transistor and the dummy word lines DWL0-DWL1 of dummy cell transistors of unselected memory blocks by the second voltage generation circuits 137_0-137_m.

Referring back to FIG. 1, the read/write circuit 140 may include a plurality of page buffers (not shown) electrically coupled to the memory array 110 via the bit lines BLs. Each of the page buffers may be electrically coupled to an associated bit line. Based on the control signal generated by the control circuit 120 and data received for storage in the memory cells during the program operation, the page buffers may selectively charge the bit lines BLs. In response to the control signal generated by the control circuit 120 during the program verify operation or the read operation, the page buffers may latch data read from the memory cells by sensing voltage variations or current in the bit lines BLs following the charging the bit lines BLs.

The operation of the semiconductor device having the above-mentioned configuration is described below.

Figure 5A:
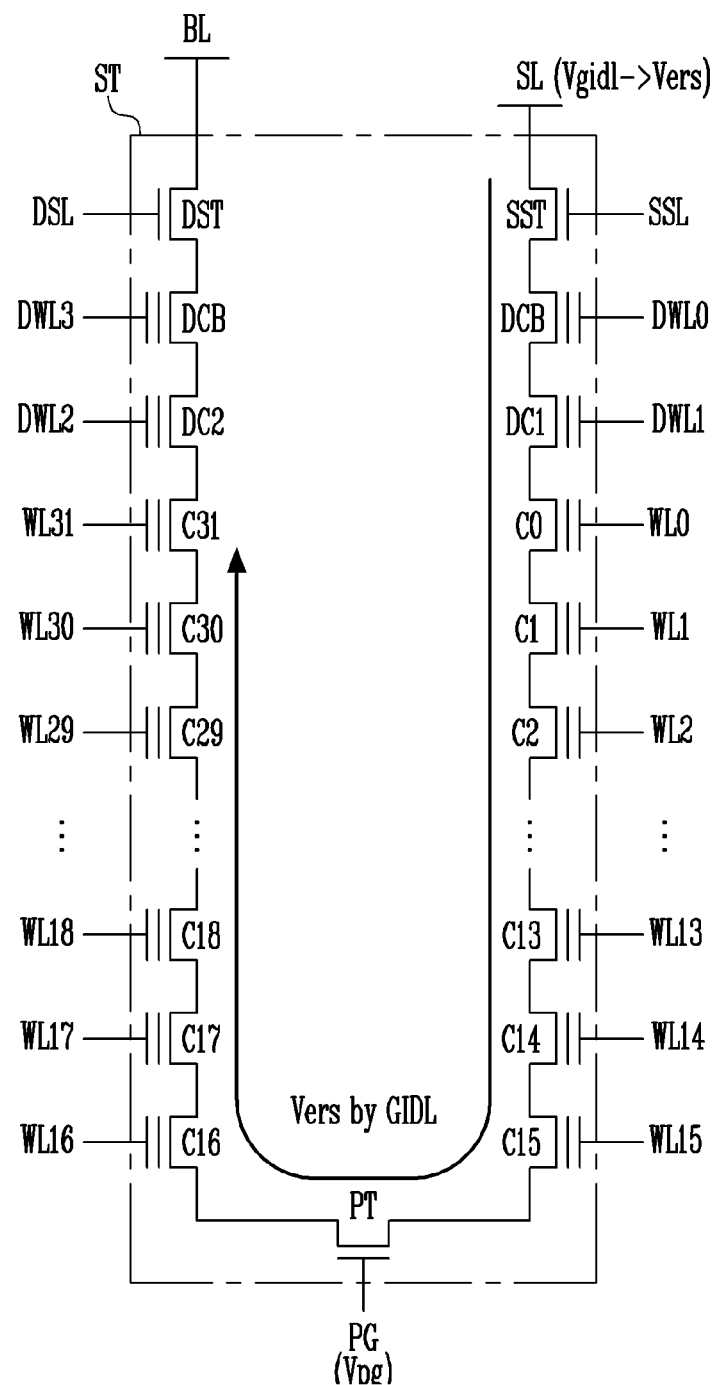
FIG. 5A is a circuit diagram representation of an embodiment of a memory string of FIG. 2.
Figure 5B:
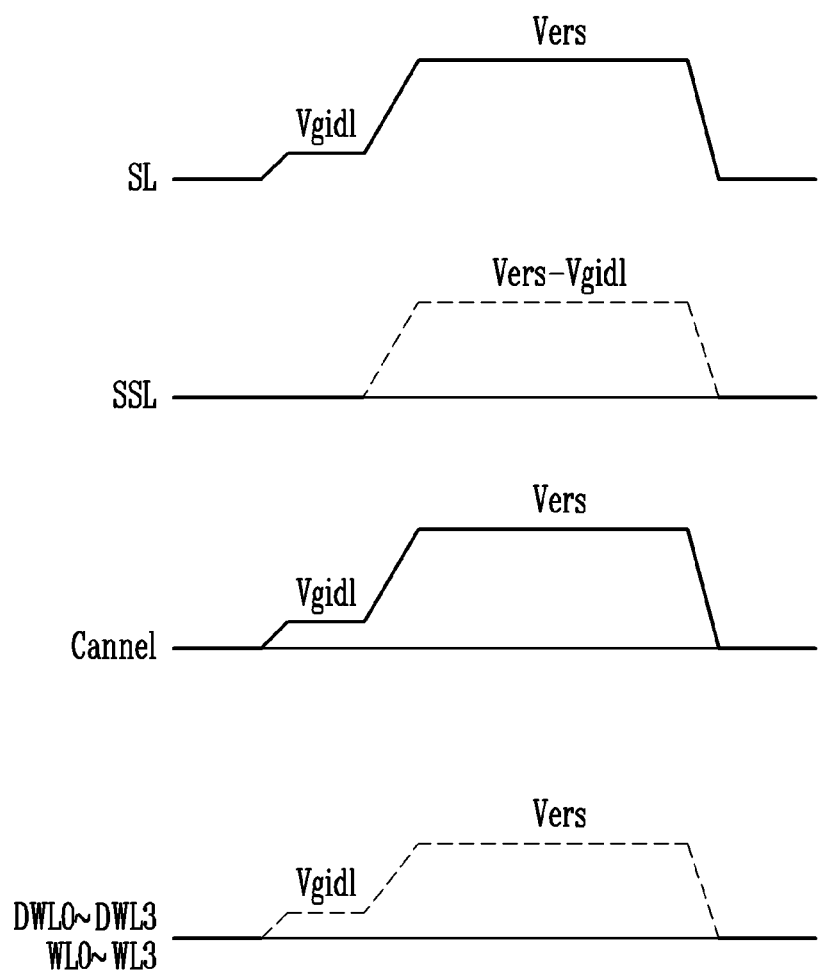

FIG. 5A is a circuit diagram representation of an embodiment of a memory string. FIG. 5B is graphical representation of the application of a number of different voltages to the memory string.

With reference to FIG. 4, FIG. 5A and FIG. 5B, the voltage supply circuit 130 of the operation circuit may apply a charge voltage Vgidl to the common source line SL to generate a Gate Induced Drain Leakage GIDL current during the erase operation. The GIDL current may be generated at a junction region (for example, source or drain) of the first select transistor SST where the charge voltage Vgidl is applied. The GIDL current may be applied to a channel region Channel of the memory strings. A channel voltage of the memory string ST may be increased by the charge voltage Vgidl. Since the select lines SSL and word lines DWL0-DWL3, WL0-WL31 of the unselected memory block are in a floating state, the electric potential of the word lines DWL0-DWL3 may be increased by the charge voltage Vgidl as a result of a capacitor coupling phenomenon as a voltage of the channel region Channel is increased.

The voltage supply circuit 130 of the operation circuit may apply an erase voltage Vers to the common source line SL for the erase operation. The electric potential of the word lines DWL0-DWL3, WL0-WL31 may be increased by the erase voltage Vers as a result of the capacitor coupling phenomenon as the voltage of the channel region Channel increases to the erase voltage Vers by the GIDL current The operation circuit may apply the erase permission voltage (for example, a ground voltage) to the word lines WL0-WLn of the selected memory block 110MB_0. The erase operation may proceed, where the threshold voltage of the memory cell transistor may be decreased due to a relatively large difference in voltage between the word lines WL0-WLn and the channel region of the selected memory block. Since the word lines DWL0-DWL3, WL0-WLn of the unselected memory blocks 110MB_m are in a floating state and maintain a relatively high electric potential, the erase operation may not proceed, and the threshold voltage of the memory cell transistors may not change due to a relatively small difference in the voltage between the word lines WO0-WLn and the channel region of the unselected memory block.

The drains of the transistors NT in the voltage transfer unit 135_m may be electrically coupled to the word lines DWL0-DWL3, WL0-WLn of the unselected memory block 110MB_m. During the erase operation, the relative voltage difference between the gate and the drain of the transistors NT in the voltage transfer unit 135_m may increase since the word lines DWL0-DWL3, WL0-WLn of the unselected memory block 110MB_m maintain a relatively high electric potential. As a result, a breakdown of the transistors NT may occur. The size of the transistors NT may be increased to reduce the likelihood of the breakdown.

When the electric potential of the channel region of the unselected memory blocks is lowered during the erase operation, the electric potential of the word lines in the floating state may be lowered, and the likelihood of a breakdown of the transistor in the voltage transfer unit of the unselected memory block may be prevented. To decrease the likelihood of a breakdown, the positive voltage may be applied to the gates of the first select transistors (source select transistors) in the unselected memory blocks. The voltage level of the voltage applied to the gate (the first select line or source select line) of the first select transistor may be adjusted.

FIG. 6A through FIG. 6D are circuit diagram representations of a memory string of an embodiment of a semiconductor device.

Figure 6A:
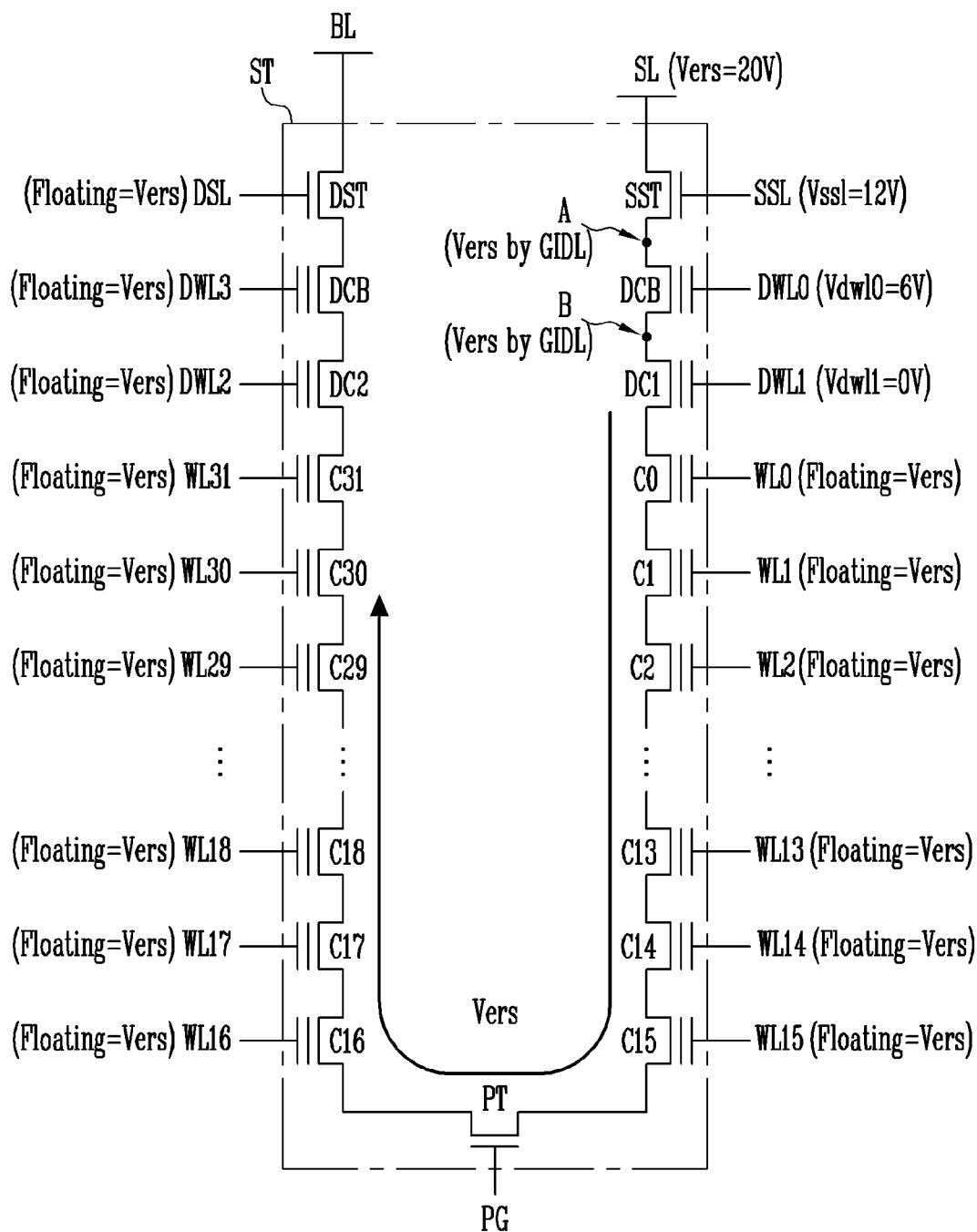
FIGS. 6A through 6D are circuit diagram representations of an embodiment of a memory string.

With reference to FIG. 4 and FIG. 6A, when the first voltage supply circuit 130 applies the erase voltage Vers (for example, 20V) to the common source line SL for the erase operation, the second voltage generation circuits 137_m of the unselected memory blocks may apply a first positive voltage Vss1 to the first select line SSL corresponding to the gate of the first select transistor SST. When the first positive voltage Vss1 is approximately 12V, the voltage difference between the drain of the first select transistor SST to which the erase voltage Vers is applied and the gate to which the first positive voltage Vss1 is applied may be approximately 8V. Due to the relatively large voltage difference, a GIDL current may be generated in the first select transistor SST and be applied to the channel region of the memory string ST. The voltage of the channel region may be increased by the erase voltage Vers. The erase voltage Vers may be transferred to the source of the first select transistor SST.

The first voltage supply circuit 130 of the operation circuit may apply a second positive voltage Vdwl0 and a third positive voltage Vdwl1 to the dummy word lines DWL0 and DWL1 corresponding to the gates of the dummy cell transistors DC0 and DC1, respectively. When the second positive voltage Vdwl0 of approximately 6V is applied to the dummy word line DWL0 and the third positive voltage Vdwl1 of approximately 0V is applied to the dummy word line DWL1, a voltage of a source B of the dummy transistor DC0 and the voltage of the channel region may increase by the erase voltage Vers due to a GIDL current generated in the dummy cell transistors DC0, DC1.

The electric potential of the word lines WL0-WLn of the unselected memory blocks may be increased by the erase voltage Vers due to the capacitor coupling phenomenon. The application of the first positive voltage Vss1 to the first select line SSL may not prevent the electric potential of the word lines WL0WLn in a floating state from increasing approximately to the erase voltage Vers if the first positive voltage Vss1 is relatively too low.

Figure 6B:
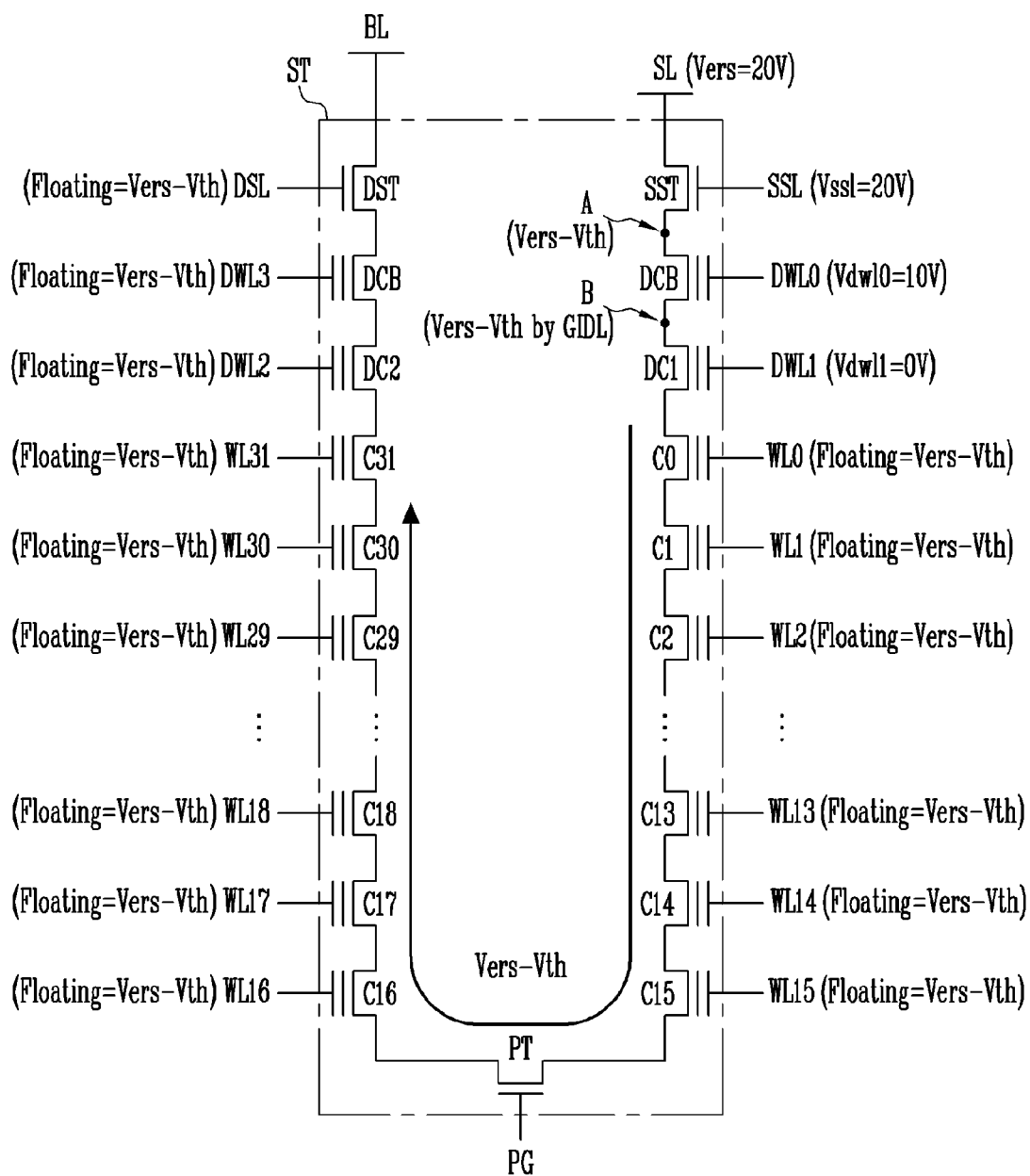

Referring to FIG. 4 and FIG. 6B, when the first voltage supply circuit 130 of the operation circuit applies the erase voltage Vers (for example, 20V) to the common source line SL during the erase operation, the second voltage generation circuits 137_m of the unselected memory blocks 110MB_m may apply the first positive voltage Vss1 to the first select line SSL corresponding to the gate of the first select transistor SST. The first positive voltage Vss1 may be substantially similar to the erase voltage Vers. When the first positive voltage Vss1 is approximately 20V, the relative difference of the voltages between the drain of the first select transistor to which the erase voltage Vers is applied and the gate to which the first positive voltage Vss1 is applied may be approximately 0V. By the voltage difference, the first select transistor SST may transfer a voltage Vers-Vth corresponding to the first positive voltage Vss1 (i.e., erase voltage) which is reduced by the threshold voltage Vth. The voltage Vers-Vth may be transferred to a source A of the first select transistor SST.

When the first voltage supply circuit 130 of the operation circuit applies the second positive voltage Vdwl0 of approximately 10V and the third positive voltage Vdwl1 of approximately 0V to the dummy word lines DWL0 and DWL1 corresponding to the gates of the dummy cell transistors DC0 and DC1, respectively, the voltage of the source B of the dummy transistor DC0 and the voltage of the channel region may be increased by the voltage Vers-Vth transferred by the first select transistor SST as the GLDL current is generated in the dummy cell transistors DC0 and DC1. The electric potential of the word lines WL0-WLn of the unselected memory blocks 110MB_m may increase by the voltage Vers-Vth due to the capacitor coupling phenomenon.

When the first positive voltage Vss1 is applied to the first select line SSL, if the first positive voltage Vss1 is relatively too high, it may be possible to lower the electric potential of the word lines WL0-WLn that are in a floating state by the threshold voltage Vth. It may be relatively difficult to prevent the electric potential from increasing to a value that is close to the value of the erase voltage Vers.

Figure 6C:
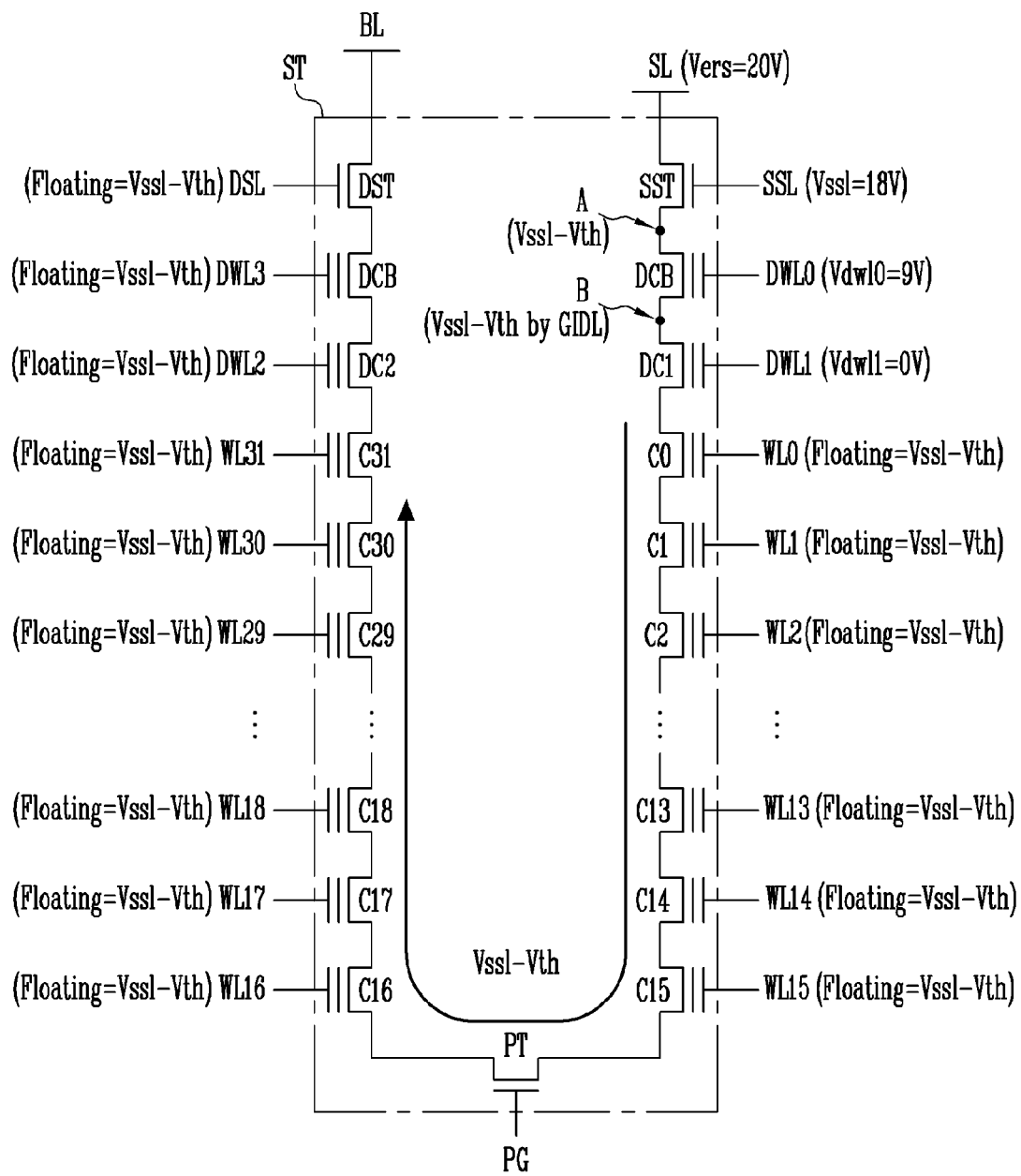

Referring to FIG. 4 and FIG. 6C, when the erase voltage Vers (for example, 20V) is applied to the common source line SL during the erase operation, the second voltage generation circuits 137_m may apply the first positive voltage Vss1 of approximately 18V to the first select line SSL to reduce or prevent GIDL in the first select transistor. To reduce or prevent GIDL in the first select transistor SST, the operation circuit 130 may adjust the difference between the erase voltage Vers and the first positive voltage Vss1. The operation circuit 130 may adjust the difference between the erase voltage Vers and the first positive voltage Vss1 so that the first select transistor SST may transfer a relatively lower voltage than the first positive voltage Vss1 to the memory cells.

When the first positive voltage Vss1 is approximately 18V, the difference between the drain of the first select transistor SST to which the erase voltage Vers is applied and the gate to which the first positive voltage Vss1 applied may be approximately 2V. Due to the voltage difference of approximately 2V, the first select transistor SST may transfer a voltage Vss1-Vth corresponding the first positive voltage Vss1 that is reduced by the threshold voltage Vth of the first select transistor SST.

When the first voltage supply circuit 130 of the operation circuit applies the second positive voltage Vdwl0 of approximately 9V and the third positive voltage Vdwl1 of approximately 0V to the dummy word lines DWL0 and DWL1 corresponding to the gates of the dummy cell transistors DC0 and DC1, respectively, the GLDL current may be generated in the dummy cell transistors DC0 and DC1 and the voltage Vers-Vth transferred by the first select transistor SST may be transferred to the source B. The electric potential of the channel region of the memory string ST may increase by the voltage Vers-Vth.

If the threshold voltage Vth of the first selected transistor SST is approximately 1V, a voltage of approximately 17V may be transferred to the source A of the first selected transistor SST. The potential of the word lines WL0-WLn of the unselected memory blocks 110MB_m may increase due to the capacitor coupling phenomenon by as much as voltage Vss1 to Vth.

When the threshold voltage Vth of the first select transistor SST is approximately 1V, the voltage of approximately 17V is transferred to the source A of the first select transistor SST. The electric potential of the word lines WL0-WLn of the unselected memory blocks 110MB_m may increase by the voltage Vss1-Vth due to the capacitor coupling phenomenon.

When the first positive voltage Vss1 is applied to the first select line SSL in consideration of the difference of the erase voltage Vers while reducing or preventing GIDL current generation, the electric potential of the word lines WL0-WLn in the floating state may be prevented from being increased. The voltage difference between the drain and the gate of the transistors NT in the voltage transfer units 135_m of the unselected memory blocks 110MB_m may be reduced and the likelihood of a breakdown of the transistors NT may be reduced. The size of transistors NT may be reduced.

Figure 6D:
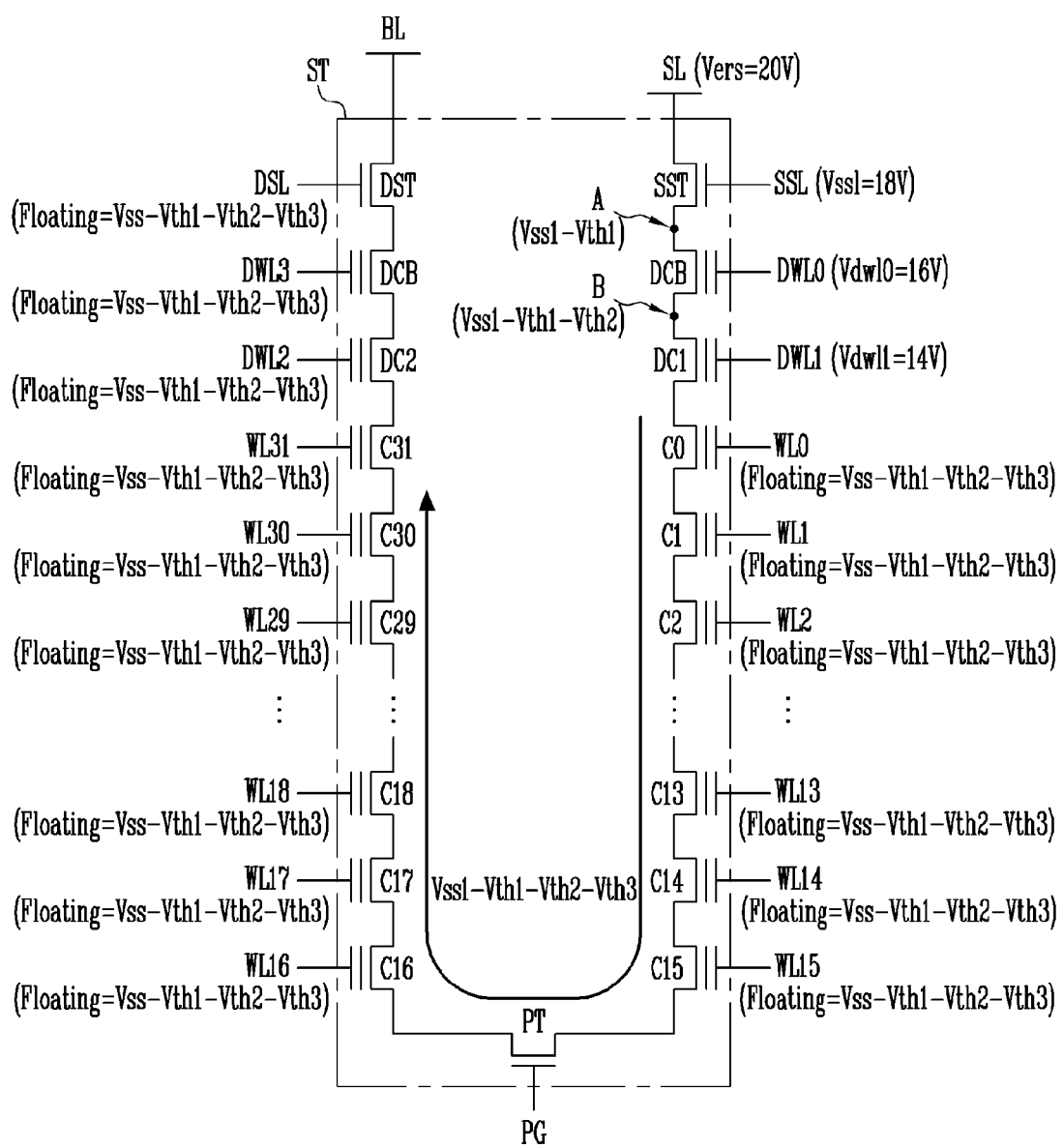

Referring to FIG. 4 and FIG. 6D, when the erase voltage Vers (for example, 20V) is applied to the common source line SL for the erase operation, the second voltage generation circuits 137_m may apply the first positive voltage Vss1 of approximately 18V to the first select line SSL to reduce or prevent GIDL of the first select transistor.

To reduce or prevent GIDL of the dummy cell transistors DE0, DC1 and at substantially the same time, to allow the dummy cell transistors DC0 and DC1 to transfer relatively lower voltages than the voltages Vdwl0 and Vdwl1 applied to the dummy word lines DWL0 and DWL1, respectively, the voltage supply circuit 130 of the operation circuit may adjust the second positive voltage Vdwl0 and the third positive voltage Vdwl1 applied to the dummy word lines DWL0 and DWL1, respectively.

To allow a first dummy cell transistor DC0 to transfer the relatively lower voltages than the second positive voltage Vdwl0 with minimal or without GIDL at the first dummy cell transistor DC0, the voltage supply circuit 130 may adjust the difference between the voltage Vss1-Vth1 (Vth1 is the threshold voltage of the first select transistor) transferred by the first select transistor SST and the second positive voltage Vdwl0. To allow the second dummy cell transistor DC0 to transfer the relatively lower voltages than the third positive voltage Vdwl1 with minimal or without GIDL in the second dummy cell transistor DC0, the voltage supply circuit 130 may adjust the difference between a voltage Vss1-Vth1-Vth2 (Vth2 is a threshold voltage of the first dummy cell transistor) transferred by the first dummy cell transistor DC0 and the third positive voltage Vdwl1.

When the first positive voltage Vss1 is approximately 18V, the second positive voltage Vdwl0 is approximately 16V, the third positive voltage Vdwl1 is approximately 14V, and the threshold voltage of each of the first select transistor SST and the dummy cell transistors DC0, DC1 is approximately 1V, a voltage of approximately 17V may be transferred to the source A of the first select transistor SST, a voltage of approximately 15V may be transferred to the source B of the first dummy cell transistor DC0, and a voltage of approximately 13V may be transferred to the channel region of the memory string ST. The electric potential of the word lines WL0-WLn of the unselected memory blocks 110MB_m may increase to approximately 13V corresponding to the voltage Vssl-Vth1-Vth2 due to the capacitor coupling phenomenon.

Since GIDL current generation is reduced or prevented and the positive voltages Vss1, Vdwl0, and Vdwl1 applied to the first select line SSL and the dummy word lines DWL0, DWL1 are controlled, the electric potential of the word lines WL0-WLn in the floating state may be prevented from increasing. The voltage difference between the drain and the gate of the transistors NT in the voltage transfer units 137_m of the unselected memory blocks 110MB_m may be reduced and the likelihood of the breakdown of the transistors NT may be reduced. The size of the transistors NT may be reduced.

Figure 7:
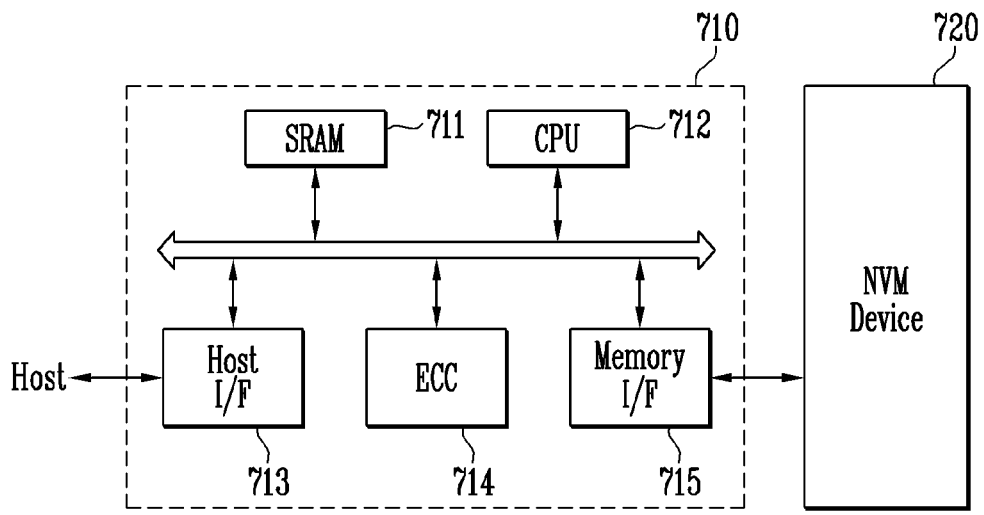
FIG. 7 is a block diagram representation of an embodiment of a memory system.

FIG. 7 is a block diagram representation of an embodiment of a memory system 700.

The memory system 700 includes a nonvolatile memory device 720 and a memory controller 710. The nonvolatile memory device 720 may include the above-described memory strings shown in FIG. 3 or 4 and the above-described operation circuits shown in FIG. 1 or 2.

The memory controller 710 may be configured to control the operation of the non-volatile memory device 720. The memory controller 710 may be a solid state disk (SSD) or a memory card in which the non-volatile memory device 720 and the memory controller 710 are combined. The SRAM 711 may function as an operation memory of a processing unit 712. A host interface 713 may include a data exchange protocol of a host that is electrically coupled to the memory system 700. An error correction block 714 may detect and correct errors data read from the non-volatile memory device 720. A memory interface 715 may interface with the non-volatile memory device 720. A memory interface 715 may interface with the non-volatile memory device 720. The processing unit 712 may perform the general control operations associated with data exchange of the memory controller 710.

Though not shown in FIG. 7, the memory system 700 may include ROM (not illustrated) that stores code data to interface with the host. The non-volatile memory apparatus 720 may be a multi-chip package that includes a plurality of flash memory chips. The memory system 700 may be provided as a storage medium that may have a relatively high reliability and relatively low error rate. An embodiment of a flash memory may be provided in a memory system such as a semiconductor disk device (a solid state disk (SSD)). For example, when the memory system 700 is an SSD, the memory controller 110 may communicate with an external device (e.g., a host) through one of the interface protocols including USB, MMC, PCI-E, SATA, PATA, SCSI, ESDI and IDE.

Figure 8:
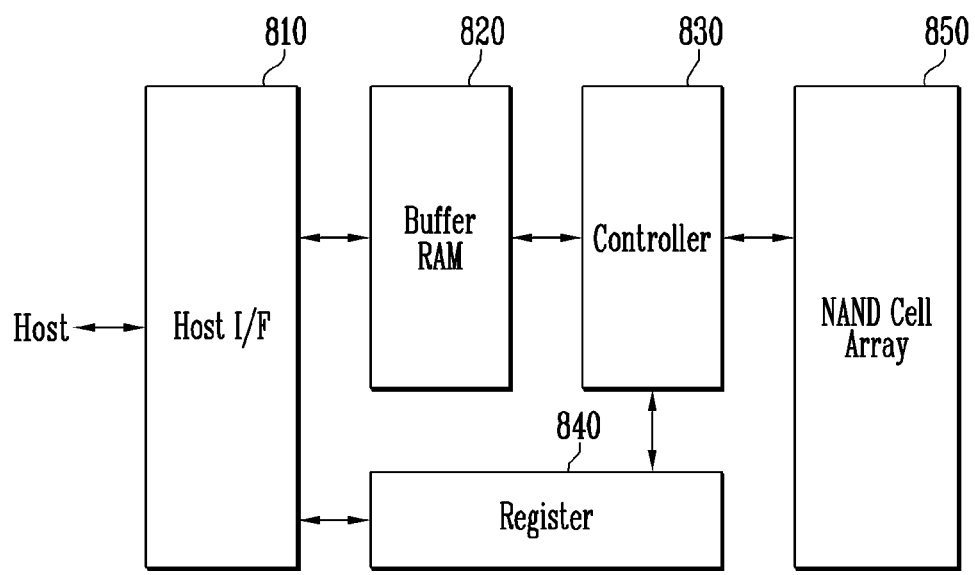
FIG. 8 is a block diagram representation of an embodiment of a fusion memory device or a fusion memory system.

FIG. 8 is a block diagram representation of an embodiment of a fusion memory apparatus or a fusion memory system that performs one or more of the program operations described above. For example, technical features of one or more of the embodiment described above may be applied to a OneNand flash memory apparatus 700 as the fusion memory apparatus.

The OneNand flash memory apparatus 800 may include a host interface (I/F) 810, a buffer RAM 820, a controller 830, a register 840 and a NAND flash cell array 850. The host interface 810 may be suitable for exchanging various types of information with a device through a different protocol. The buffer RAM 820 may have built-in codes for driving the memory apparatus or temporarily store data. The controller 830 may be suitable for controlling read and program operations and every state in response to a control signal and a command that are received from an external device. The register 840 may be suitable for storing data including instructions, addresses and configurations defining a system operating environment in the memory apparatus. The NAND flash cell array 850 may include operating circuits including non-volatile memory cells, the voltage supply circuit and the read/write circuit described with reference to FIG. 1 or FIG. 2. As a memory array of the NAND flash memory cell array, a memory array including the memory cells illustrated in FIG. 3 or 4 may be used.

Figure 9:
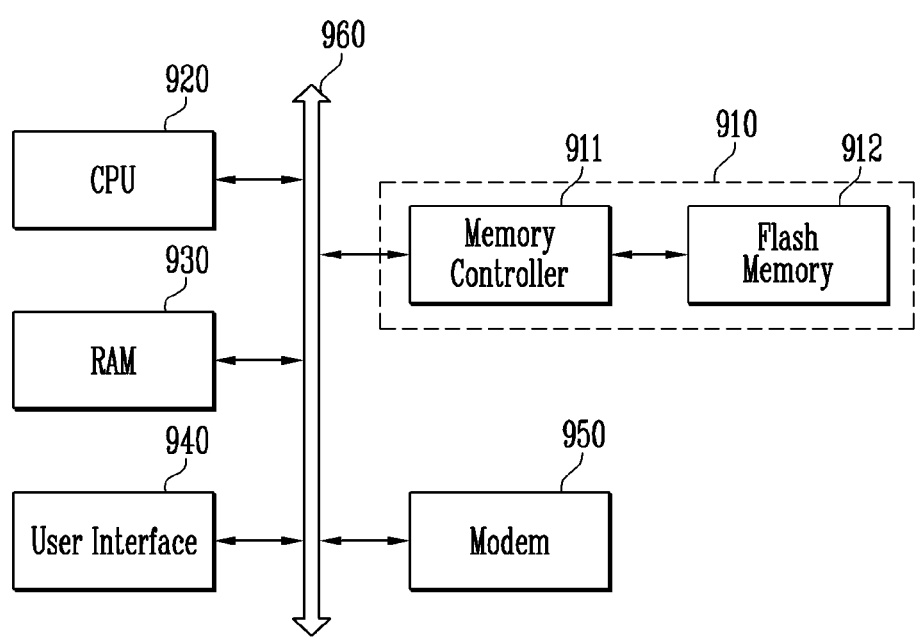
FIG. 9 is a block diagram representation of a computing system including en embodiment of a flash memory device.

FIG. 9 is a block diagram representation of a computing system 900 including an embodiment of a flash memory apparatus 912.

The computing system 900 may include a microprocessor (CPU) 920, RAM 930, a user interface 940, a modem 950, such as a baseband chipset, and a memory system 910 that are electrically coupled to a system bus 960. If the computing system 900 is a mobile device, then a battery may be provided to apply operating voltages to the computing system 900. Though not shown in FIG. 9, the computing system 900 may include application chipsets, a Camera Image Processor (CIS), or mobile DRAM. The memory system 910 may form a Solid State Drive/Disk (SSD) that uses a non-volatile memory to store data. The memory system 910 may be provided as a fusion flash memory (e.g., OneNAND flash memory).

The electrical characteristics and reliability may be improved by changing operation conditions.

While certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device, comprising:
a plurality of memory blocks, wherein each of the plurality of memory blocks comprises:
a first select transistor electrically coupled to a common source line;
a second select transistor electrically coupled to a bit line;
a plurality of memory cells electrically coupled between the first and second select transistors; and
an operation circuit suitable for applying operation voltages for a program operation, a read operation, and an erase operation to a selected memory block selected from the plurality of memory blocks, applying a first positive voltage to gates of the first select transistors of unselected memory blocks of the plurality of memory blocks, and setting word lines coupled to gates of the memory cells of the unselected memory blocks to a floating state when an erase voltage is applied to the common source line during the erase operation.

2. The semiconductor device of claim 1, wherein the operation circuit is suitable for adjusting a difference between the erase voltage and the first positive voltage to reduce a gate induced drain leakage (GIDL) phenomenon in the first select transistor.

3. The semiconductor device of claim 1, wherein the operation circuit is suitable for adjusting a difference between the erase voltage and the first positive voltage, wherein the first select transistor transfers a voltage that is relatively lower than the first positive voltage to the plurality of memory cells.

4. The semiconductor device of claim 1, wherein each of the plurality of memory cells comprises:
a first dummy memory cell electrically coupled to the first select transistor;
a second dummy memory cell electrically coupled to the second select transistor; and
main memory cells electrically coupled between the first and second dummy memory cells.

5. The semiconductor device of claim 4, wherein the operation circuit is suitable for applying a second positive voltage to a gate of the first dummy memory cell of each of the unselected memory blocks during the erase operation.

6. The semiconductor device of claim 5, wherein the second positive voltage is relatively lower than the first positive voltage.

7. The semiconductor device of claim 5, wherein the operation circuit is suitable for adjusting a difference between the voltage transferred by the first select transistor and the second positive voltage, wherein a voltage that is relatively lower than the second positive voltage is transferred by the first dummy memory cell with a reduction in a gate induced drain leakage (GIDL) in the first dummy memory cell.

8. The semiconductor device of claim 5, wherein gates of the main memory cells, the second dummy memory cell and the second select transistor in the unselected memory blocks are set to a floating state.

9. The semiconductor device of claim 1, wherein the operation circuit comprises:
a first voltage generation circuit suitable for transmitting the operation voltages to global lines and transmitting the erase voltage to the common source line during the erase operation;
a switching circuit configured to electrically couple first and second select lines and word lines of the selected memory block to the global lines in response to block select signals; and
a second voltage generation circuit suitable for applying the first positive voltage to first select lines of the first select transistors in the unselected memory blocks during the erase operation.

10. The semiconductor device of claim 9, wherein the second voltage generation circuit is suitable for applying the first positive voltage to the first select lines of the first select transistors in response to inverted block select signals.

11. The semiconductor device of claim 1, wherein the word lines comprise:
a first dummy word line coupled to a gate of a first dummy memory cell which is electrically coupled to the first select transistor;
a second dummy word line coupled to a gate of a second dummy memory cell which is electrically coupled to the second select transistor; and
main word lines of main memory cells disposed between the first and second dummy word lines.

12. The semiconductor device of claim 11, wherein the operation circuit is suitable for applying a second positive voltage to the first dummy word line of the first dummy memory cell in each of the unselected memory blocks during the erase operation.

13. The semiconductor device of claim 12, wherein the second positive voltage is relatively lower than the first positive voltage.

14. The semiconductor device of claim 12, wherein the operation circuit is suitable for adjusting a difference between a voltage transferred by the first select transistor and the second positive voltage so that a relatively lower voltage than the second positive voltage is transferred by the first dummy memory cells and a GIDL phenomenon in the first dummy memory cell is reduced.

15. The semiconductor device of claim 11, wherein the second dummy word lines, and the second select lines in the unselected memory blocks are set to a floating state.

16. The semiconductor device of claim 1, wherein each of the memory blocks further comprises a pipe transistor formed on a semiconductor substrate,
the first select transistor and a first subset of the plurality of the memory cells are electrically coupled in series between the common source line and the pipe transistor, and
the second select transistor and a second subset of the plurality of memory cells are electrically coupled in series between the bit line and the pipe transistor.

* * * * *